United States Patent
Gupta et al.

(10) Patent No.: US 11,016,519 B2
(45) Date of Patent: May 25, 2021

(54) PROCESS COMPENSATED GAIN BOOSTING VOLTAGE REGULATOR

(71) Applicant: STMicroelectronics International N.V., Schiphol (NL)

(72) Inventors: Ankit Gupta, Delhi (IN); Nitin Gupta, Kurukshetra (IN); Prashutosh Gupta, Up (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/694,028

(22) Filed: Nov. 25, 2019

(65) Prior Publication Data

US 2020/0183439 A1 Jun. 11, 2020

Related U.S. Application Data

(60) Provisional application No. 62/776,198, filed on Dec. 6, 2018.

(51) Int. Cl.
| | |
|---|---|
| G05F 1/575 | (2006.01) |
| H03F 3/16 | (2006.01) |
| H03F 3/45 | (2006.01) |
| G05F 3/26 | (2006.01) |

(52) U.S. Cl.
CPC ............. G05F 3/262 (2013.01); G05F 1/575 (2013.01); *H03F 3/16* (2013.01); *H03F 3/45179* (2013.01)

(58) Field of Classification Search
CPC ......... G05F 1/575; H03F 3/16; H03F 3/45179
USPC .................................................. 323/280, 315
See application file for complete search history.

(56) References Cited

U.S. PATENT DOCUMENTS

| | | | |
|---|---|---|---|
| 4,908,566 A | 3/1990 | Tesch | |
| 5,966,005 A | 10/1999 | Fujimori | |
| 6,465,994 B1 | 10/2002 | Xi | |
| 6,960,907 B2 | 11/2005 | Poss | |
| 6,965,218 B2 | 11/2005 | Scoones et al. | |
| 6,977,490 B1 | 12/2005 | Zhang et al. | |
| 7,405,546 B2 | 7/2008 | Amrani et al. | |
| 8,115,463 B2 | 2/2012 | Wang | |
| 8,786,268 B2 | 7/2014 | Li et al. | |
| 9,671,803 B2 | 6/2017 | Oikarinen | |
| 2003/0102851 A1* | 6/2003 | Stanescu | G05F 1/575 323/280 |

(Continued)

*Primary Examiner* — Gary A Nash
(74) *Attorney, Agent, or Firm* — Crowe & Dunlevy

(57) ABSTRACT

A voltage regulator includes an error amplifier producing an error voltage from a reference voltage and a feedback voltage. A voltage-to-current converter converts the error voltage to an output current, and a feedback resistance generates the feedback voltage from the output current. The error amplifier includes a differential pair of transistors receiving the feedback voltage and the reference voltage, a first pair of transistors operating in saturation and coupled to the differential pair of transistors at an output node and a bias node, a second pair of transistors operating in a linear region and coupled to the first pair of transistors at a pair of intermediate nodes. A compensation capacitor is coupled to one of the pair of intermediate nodes so as to compensate the error amplifier for a parasitic capacitance. An output at the output node is a function of a difference between the reference voltage and feedback voltage.

29 Claims, 8 Drawing Sheets

(56) References Cited

U.S. PATENT DOCUMENTS

| | | | |
|---|---|---|---|
| 2009/0322429 A1* | 12/2009 | Ivanov | H03F 3/45179 330/257 |
| 2010/0148735 A1* | 6/2010 | Napravnik | G05F 1/575 323/280 |
| 2011/0001458 A1* | 1/2011 | Bansal | G05F 1/575 323/282 |
| 2014/0312867 A1* | 10/2014 | Pulvirenti | G05F 1/56 323/280 |
| 2016/0187903 A1* | 6/2016 | Cui | G05F 1/45 323/280 |

* cited by examiner

PROCESS COMPENSATED GAIN BOOSTING VOLTAGE REGULATOR

RELATED APPLICATION

This application claims the priority of United States Provisional Application for Patent No. 62/776,198, filed Dec. 6, 2018, the contents of which are incorporated by reference to the maximum extent allowable under the law.

TECHNICAL FIELD

This application is directed to the field of voltage regulators, and more particularly to an output stage compensated voltage regulator employing an error amplifier design in which gain, bandwidth, and bias currents are decoupled.

BACKGROUND

Handheld battery powered electronic devices such as tablets and smartphones have been in wide use in recent years, with usage rates that are ever increasing, and with additional functionality being added on a regular basis.

A common type of voltage regulator used in such electronic devices is known as a low dropout (LDO) regulator, which can operate with a small input to output voltage difference, and which provides a high degree of efficiency and heat dissipation. A typical LDO regulator includes an error amplifier that controls a voltage to current converter, such as field effect transistor (FET) or bipolar junction transistor (BJT), to cause sinking or sourcing of current from or to an output node. One input of the error amplifier receives a feedback signal, while the other receives a reference voltage. The error amplifier controls the voltage to current converter so as to maintain a constant output voltage.

One such example voltage regulator 10 is shown in FIG. 1A. The voltage regulator 10 includes an error amplifier 11 receiving as input a reference voltage Vref and a feedback voltage Vfb. The error amplifier 11 produces an output Vout_int that is equal to the difference between Vref and Vfb, multiplied by a gain of the error amplifier 11. Vout_Int is fed to a voltage to current converter 12, which produces an output current Iout based upon Vout_Int. Iout flows through the feedback circuit 13 (such as a resistive voltage divider) to produce the feedback voltage Vfb, and through the load resistance RL 14 and load capacitance CL to produce the output voltage Vout.

Details of the error amplifier 11 are shown in FIG. 1B. The error amplifier 11 includes a differential pair of input transistors 15, a tail current source 16, and an active load 17. The differential pair of input transistors 15 is comprised of NMOS transistors N1 and N2. NMOS transistor N1 has its drain coupled to a bias node Nbias, its source coupled to a tail current source 16, and its gate coupled to receive the feedback voltage Vfb. NMOS transistor N2 has its drain coupled to an output node Nout, its source coupled to the tail current source 16, and its gate coupled to receive the reference voltage Vref.

The tail current source 16 is comprised of an NMOS transistor N3 having its drain coupled to the sources of NMOS transistors N1 and N2, its source coupled to ground, and its gate coupled to a bias voltage Vbias, thereby drawing a bias current Ibias.

The active load 17 is comprised of PMOS transistors P1 and P2 in a current mirror relationship with the sources of P1 and P2 coupled to a supply voltage Vsup, the gates of P1 and P2 tied to one another and to the bias node Nbias, the drain of P1 coupled to the bias node Nbias, and the drain of P2 coupled to the output node Nout.

The NMOS transistors N1 and N2 serve to generate an output at Nout that is a difference between Vfb and Vref, multiplied by a gain. The PMOS transistors P1 and P2 in a current mirror arrangement act as an active load.

Note that a parasitic capacitance Cpar forms between the output node Nout and the supply node Vsup. Compensation is required for suitable operation. Therefore, a compensation capacitor Ccomp is coupled in series with a compensation resistor Rcomp between the supply node Vsup and the output node Nout, serving to add a zero at or around the non-dominant pole location.

The regulator 10 utilizing the error amplifier 11 therefore produces poles of $$\frac{1}{C_{comp}*(R_{comp}+r_{o1})}, \frac{1}{C_{par}*(R_{comp}||r_{o1})}, \text{ and } \frac{1}{C_L*R_L},$$

and a zero of $$\frac{1}{C_{comp}*R_{comp}}.$$

The resistance $r_{o1}$ is the output resistance of PMOS transistor P2. Assuming that $C_L$ is substantially greater than Cpar, a desired bandwidth extension or reduction in bias current Ibias, such as may be desired due to design parameters, can potentially be obtained through proper selection of Rcomp.

For this compensation to remain as intended over process, voltage, and temperature (PVT) variation, $R_{comp}$ would need to track $r_{o1}$. However, this tracking is not possible, as $R_{comp}$ is formed by a poly-resistor process, while $r_{o1}$ is formed by a MOS process. In addition, the temperature coefficients are not the same between poly-resistor and MOS processes.

Therefore, in order to permit production of a voltage regulator 10 where compensation remains stable and consistent over PVT variation, further development is needed.

SUMMARY

Disclosed herein is an error amplifier including a differential pair of input transistors receiving a feedback voltage and a reference voltage, and a first pair of transistors coupled to the differential pair of input transistors at an output node and a bias node, with the first pair of transistors configured to operate in a saturation region. A second pair of transistors is coupled to the first pair of transistors at a pair of intermediate nodes and is configured to operate in a linear region. A compensation capacitor is coupled to one of the pair of intermediate nodes so as to compensate the error amplifier for a parasitic capacitance at the output node. An output of the error amplifier at the output node is a function of a difference between the reference voltage and the feedback voltage.

Gates of the second pair of transistors may be directly electrically connected to gates of the first pair of transistors and further connected to one of the second pair of transistors.

The differential input pair of transistors may be n-channel transistors, the first pair of transistors may be p-channel transistors, and the second pair of transistors may be p-channel transistors having sources coupled to a supply voltage and drains coupled to the pair of intermediate nodes.

The parasitic capacitance may be coupled between the output node and the supply voltage, and the compensation capacitor may be coupled between one of the pair of intermediate nodes and the supply voltage.

The parasitic capacitance may be coupled between the output node and the supply voltage. The compensation capacitor may include a first compensation capacitor coupled between a first of the pair of intermediate nodes and the supply voltage, and a second compensation capacitor coupled between a second of the pair of intermediate nodes and the supply voltage.

The parasitic capacitance may be coupled between the output node and the supply voltage, and the compensation capacitor may be coupled between the pair of intermediate nodes.

The second pair of transistors may have different sizes and the first pair of transistors may have a same size.

The second pair of transistors may have a same first size and the first pair of transistors may have a same second size, with the first size being larger than the second size.

One of the second pair of transistors may have a first size, another of the second pair of transistors may have a second size different from the first size, and the first pair of transistors may have a same third size, with the first and second sizes being larger than the third size.

Also disclosed herein is a circuit including a tail current source and a differential pair. The differential pair includes a first NMOS transistor having a source directly electrically connected to the tail current source, a drain directly electrically connected to a bias node, and a gate biased by a feedback voltage, and a second NMOS transistor having a source directly electrically connected to the tail current source, a drain directly electrically connected to an output node, and a gate biased by a reference voltage. A load circuit includes a first PMOS transistor having a drain directly electrically connected to the bias node, a source, and a gate directly electrically connected to the bias node, a second PMOS transistor having a drain directly electrically connected to the output node, a source directly electrically connected to an intermediate node, and a gate directly electrically connected to the bias node, a third PMOS transistor having a drain directly electrically connected to the source of the first PMOS transistor, a source directly electrically connected to a supply node, and a gate directly electrically connected to the bias node, and a fourth PMOS transistor having a drain directly electrically connected to the intermediate node, a source directly electrically connected to the supply node, and a gate directly electrically connected to the bias node. A compensation capacitor is directly electrically connected to the intermediate node.

The compensation capacitor may be directly electrically connected between the intermediate node and the supply node.

The compensation capacitor may be directly electrically connected between the intermediate node and the drain of the third PMOS transistor.

An additional compensation capacitor may be directly electrically connected between the supply node and the drain of the third PMOS transistor.

The third and fourth PMOS transistors may have a same width and length.

The third PMOS transistor may have a different width and length than the fourth PMOS transistor.

Also disclosed herein is a voltage regulator including an error amplifier receiving a reference voltage and a feedback voltage as input and producing an error voltage as a function of a difference between the reference voltage and the feedback voltage, a voltage to current converter configured to convert the error voltage to an output current, and feedback resistance receiving the output current and generating the feedback voltage. The error amplifier may include a differential pair of input transistors receiving the feedback voltage and the reference voltage, a first pair of transistors coupled to the differential pair of input transistors at an output node and a bias node, with the first pair of transistors configured to operate in a saturation region, a second pair of transistors coupled to the first pair of transistors at a pair of intermediate nodes and configured to operate in a linear region, and a compensation capacitor coupled to one of the pair of intermediate nodes so as to compensate the error amplifier for a parasitic capacitance at the output node. An output of the error amplifier at the output node is a function of a difference between the reference voltage and the feedback voltage.

Gates of the second pair of transistors may be directly electrically connected to gates of the first pair of transistors and further connected to one of the second pair of transistors.

The differential input pair of transistors may be n-channel transistors, the first pair of transistors may be p-channel transistors, and the second pair of transistors may be p-channel transistors having sources coupled to a supply voltage and drains coupled to the pair of intermediate nodes.

The parasitic capacitance may be between the output node and the supply voltage, and the compensation capacitor may be coupled between one of the pair of intermediate nodes and the supply voltage.

The parasitic capacitance may be between the output node and the supply voltage. The compensation capacitor may include a first compensation capacitor coupled between a first of the pair of intermediate nodes and the supply voltage, and a second compensation capacitor coupled between a second of the pair of intermediate nodes and the supply voltage.

The parasitic capacitance may be between the output node and the supply voltage, and wherein the compensation capacitor may be coupled between the pair of intermediate nodes.

The second pair of transistors may have different sizes and the first pair of transistors may have a same size.

The second pair of transistors may have a same first size and the first pair of transistors may have a same second size, with the first size being larger than the second size.

One of the second pair of transistors may have a first size, another of the second pair of transistors may have a second size different from the first size, and the first pair of transistors may have a same third size, with the first and second sizes being larger than the third size.

A method aspect is disclosed herein. The method is a method of providing independence between DC gain and bandwidth in a differential amplifier, and includes coupling a load to a differential input pair of transistors so that an output node of the load is decoupled from an intermediate node of the load, and operating a first pair of transistors of the load in a saturation region and operating a second pair of transistors of the load in a linear region. The method further includes coupling a compensation capacitor to the intermediate node so as to add a second pole and additional zero to a transfer function of the differential amplifier, with the second pole serving to increase low frequency gain of the differential amplifier. The transfer function has a first pole and a zero but would not have the second pole and the additional zero without the compensation capacitor.

Also disclosed herein is an error amplifier including an input stage receiving a feedback voltage and a reference voltage, a linear amplification stage, a saturation amplification stage coupled between the input stage and the linear amplification stage, and a compensation stage coupled across the linear amplification stage.

In some instances, the linear amplification stage may be coupled between the saturation amplification stage and a supply voltage, and a tail current source may be coupled between the input stage and ground.

The compensation stage may include a pair of compensation capacitors coupled in parallel with the compensation stage, or may include a single compensation transistor coupled in parallel with the compensation stage.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2:
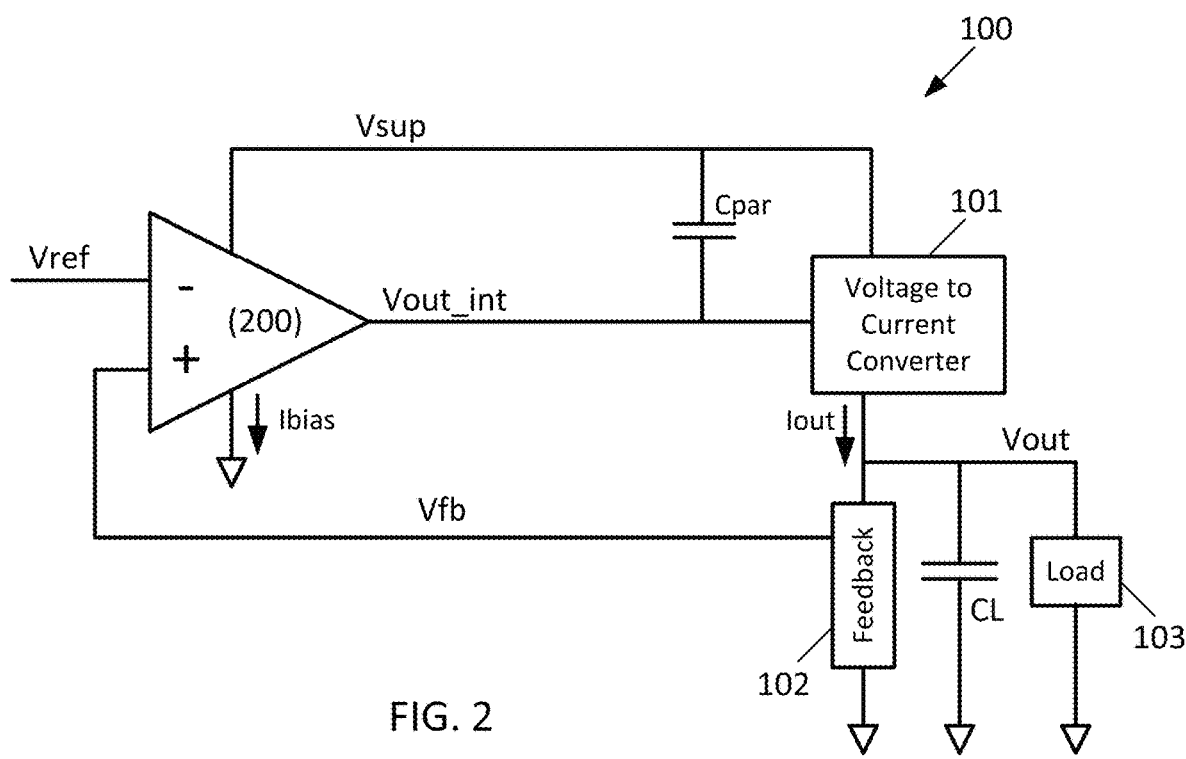
FIG. 2 is a block diagram of a voltage regulator disclosed herein.

A voltage regulator 100 is shown in FIG. 2. The voltage regulator 100 includes an error amplifier 200 receiving as input a reference voltage Vref and a feedback voltage Vfb. The error amplifier 200 produces an output Vout_int that is equal to the difference between Vref and Vfb, multiplied by a gain of the error amplifier 200. Vout_Int is fed to a voltage to current converter 101, which produces an output current Iout based upon Vout_Int. Iout flows through the feedback resistance 102 to produce the feedback voltage Vfb, and through the load resistance 103 and load capacitance CL to produce the output voltage Vout.

Figure 3:
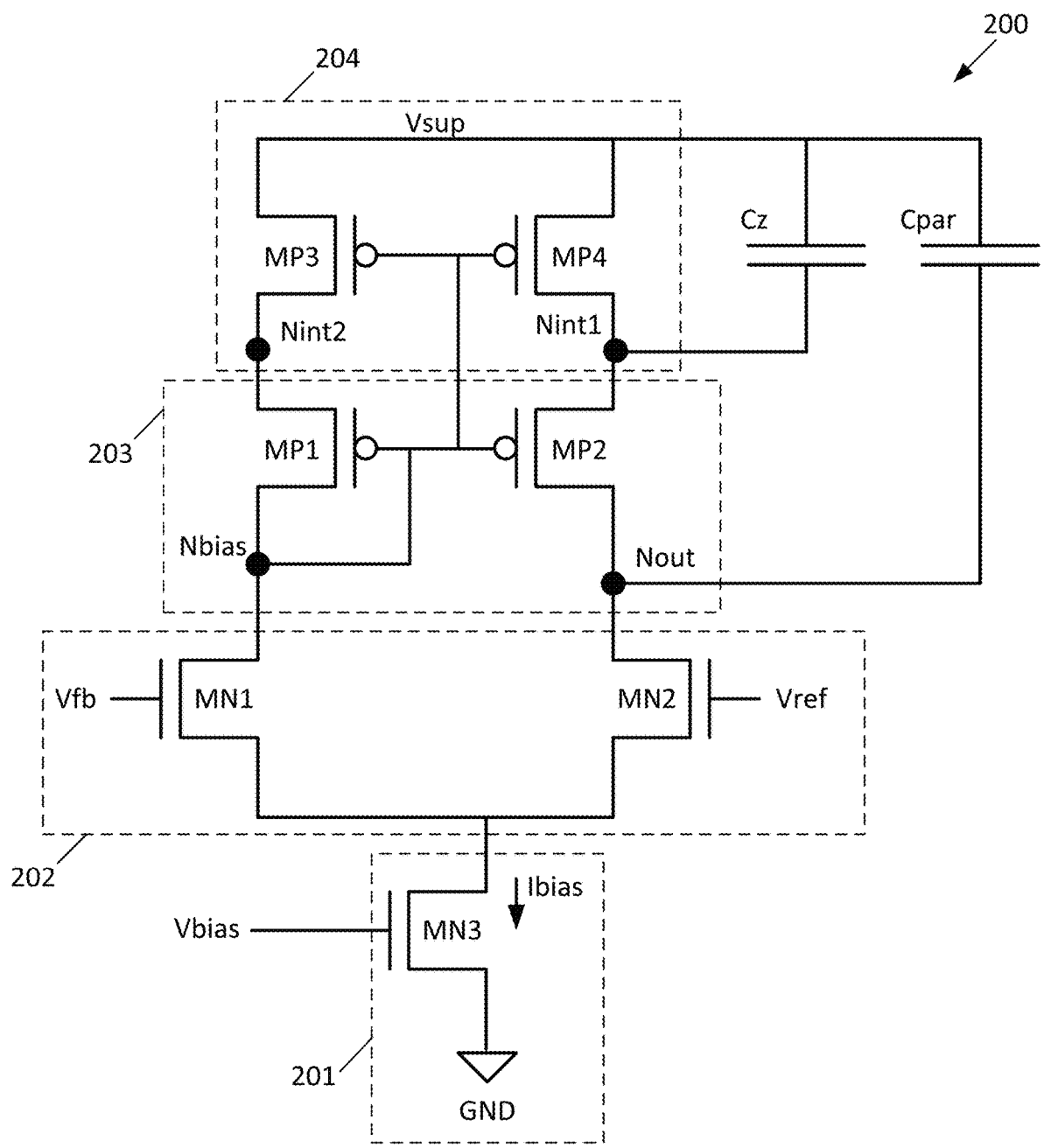
FIG. 3 is a schematic diagram of the error amplifier of the voltage regulator of FIG. 2.

Details of the error amplifier 200 are shown in FIG. 3. The error amplifier 200 includes a differential pair of input transistors 202, a tail current source 201, an active load formed from current mirror 203, and a pair of stacked transistors 204. The pair of stacked transistors 204 serve to boost the output impedance seen at node NOUT at low frequencies.

The differential pair of input transistors 202 is comprised of NMOS transistors MN1 and MN2. NMOS transistor MN1 has its drain coupled to a bias node Nbias, its source coupled to the tail current source 201, and its gate coupled to Vfb. NMOS transistor MN2 has its drain coupled to an output node Nout, its source coupled to the tail current source 201, and its gate coupled to Vref.

The tail current source 201 is comprised of an NMOS transistor MN3 having its drain coupled to the sources of NMOS transistors MN1 and MN2, its source coupled to ground, and its gate coupled to a bias voltage Vbias, thereby drawing a bias current Ibias.

The current mirror 203 is comprised of PMOS transistors MP1 and MP2, with the sources of MP1 and MP2 coupled to the intermediate nodes Nint2 and Nint1, the gates of MP1 and MP2 tied to one another and to the bias node Nbias, the drain of MP1 coupled to the bias node Nbias, and the drain of MP2 coupled to the output node Nout.

The pair of stacked transistors 204 includes PMOS transistors MP3 and MP4. The PMOS transistor MP3 has its source coupled to the supply node Vsup, its drain coupled to the intermediate node Nint2, and its gate coupled to the bias node Nbias. The PMOS transistor MP4 has its source coupled to the supply node Vsup, its drain coupled to the intermediate node Nint1, and its gate coupled to the bias node Nbias. Note that due to the fact that the gates of MP3 and MP4 are coupled to the bias node Nbias, and due to the drop in voltage across MP3 and MP4 (meaning that the gate to source voltages of MP1 and MP2 are less than the gate to source voltages of MP3 and MP4) transistors MP3 and MP4 operate in a linear region of operation while transistors MP1 and MP2 operate in a saturation region. Transistors MN1, MN2, and MN3 also operate in the saturation region.

In operation, the NMOS transistors MN1 and MN2 serve to generate an output at Nout that is a difference between Vfb and Vref, multiplied by a gain. A parasitic capacitance Cpar forms between the output node Nout and the supply node Vsupp and requires compensation. Such compensation is required for suitable operation. However, as explained above, simply adding a compensation impedance between the output node Nout and the supply node Vsup does not provide the desired tracking across PVT.

For this reason, the transistors MP3 and MP4 are used to provide intermediate nodes Nint1 and Nint2 that are decoupled from the output node Nout and bias node Nbias. By coupling compensation capacitance Cz between the intermediate node Nint1 and the supply voltage, proper compensation can be provided to enable decoupling between gain and bandwidth of the error amplifier 200 as well as the voltage regulator 100, and without the need of increasing the bias current pulled by the tail current source 301.

The DC gain of the error amplifier 200 is: $gm_1 * (gm_{p1} * r_{o1} * R_{lin} + R_{lin} + r_{o1})$, where $gm_1$ is the transconductance of MN1 or MN2, $gm_{p1}$ is the transconductance of MP2, $r_{o1}$ is the output resistance of MP2, and $R_{lin}$ is the linear resistance of MP4.

The resulting poles of the error amplifier 200 are:

$$\frac{1}{R_{lin} * C_z} \text{ and } \frac{1}{R_{01} * C_{par}},$$

and the resulting zero of the error amplifier 200 is:

$$\frac{(1 + gm_{p1})(R_{lin})}{R_{lin} * C_z}.$$

Figure 1A:
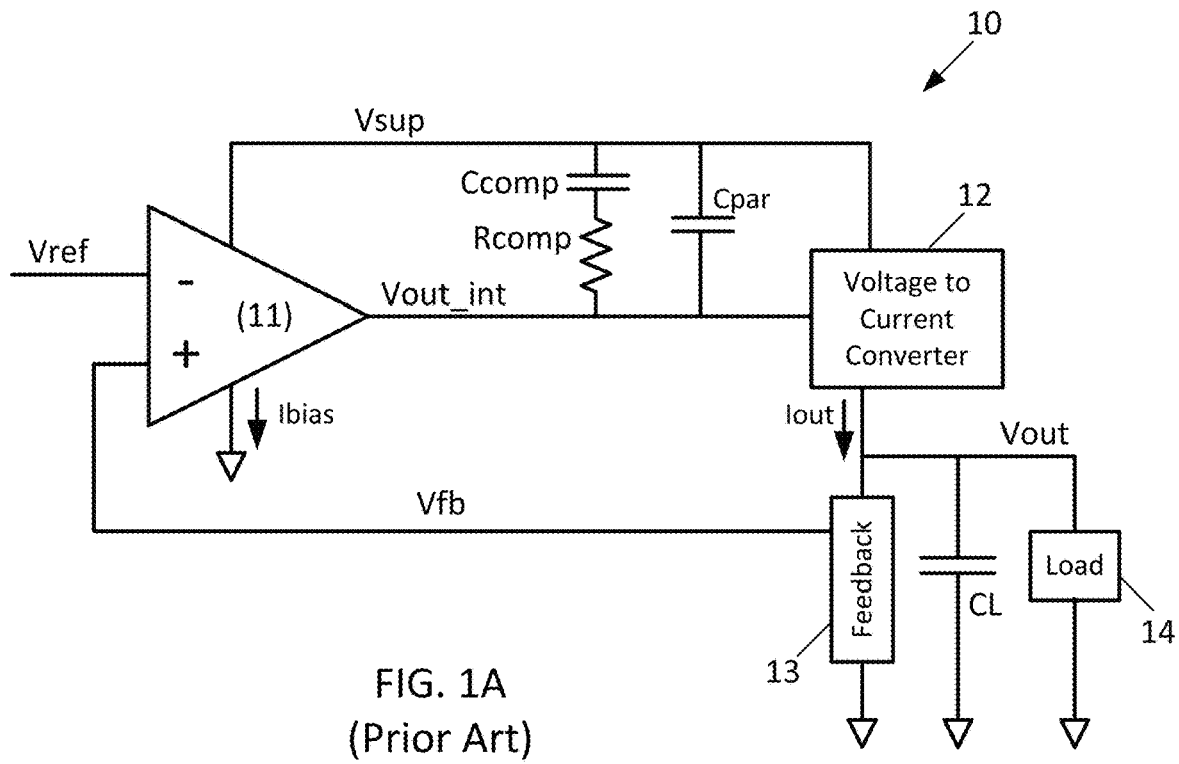
FIG. 1A is a block diagram of a prior art voltage regulator.
Figure 1B:
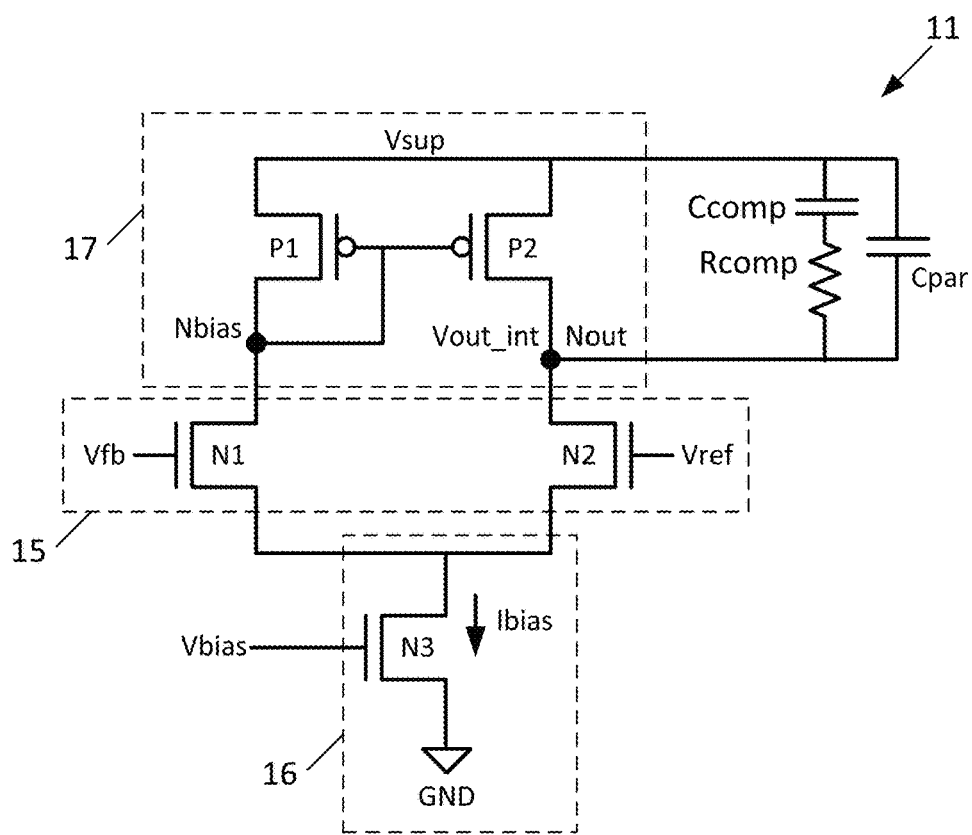
FIG. 1B is a schematic diagram of the error amplifier of the prior art voltage regulator of FIG. 1A.
Figure 4:
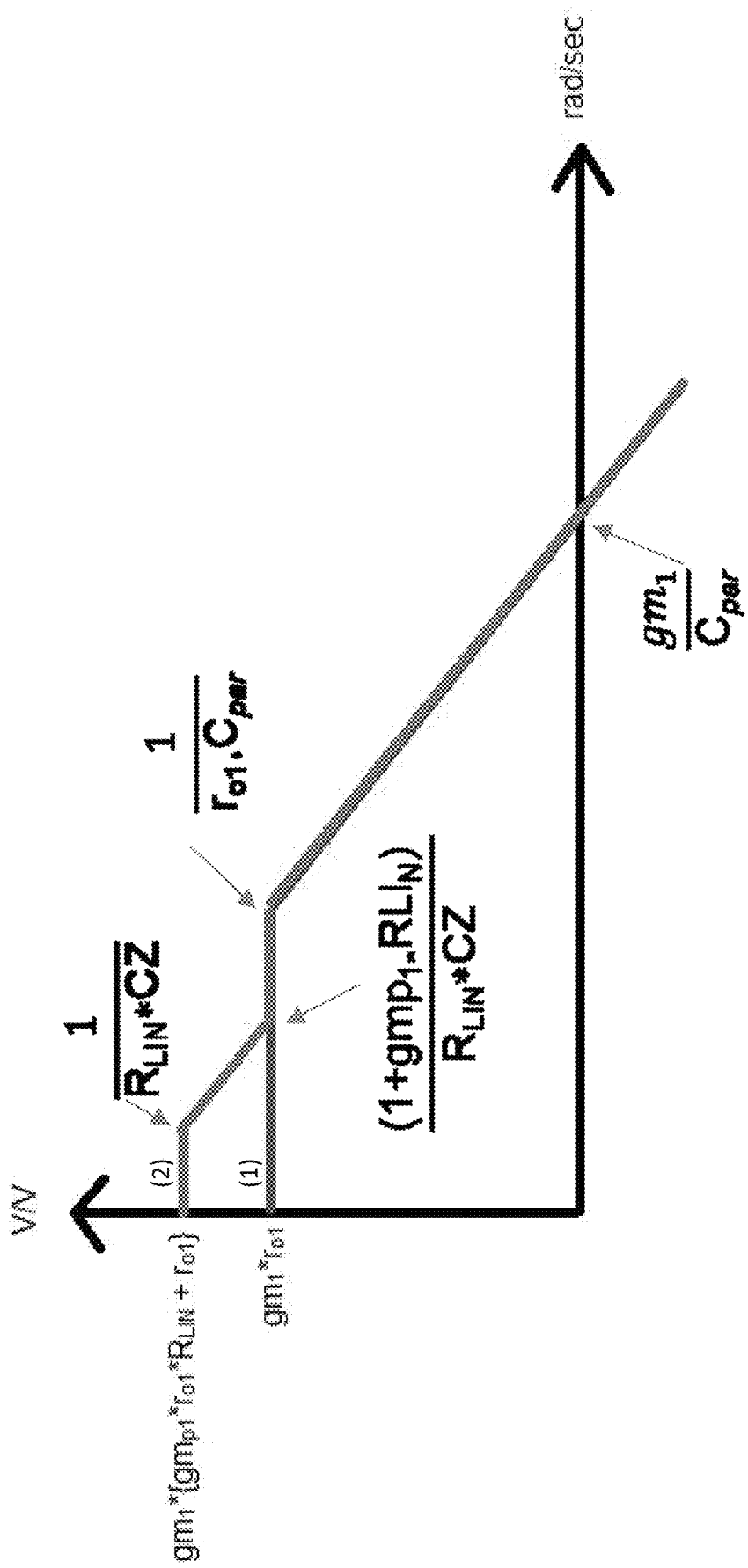
FIG. 4 is a magnitude of a bode plot of the error amplifier of FIG. 3.

These are shown in the bode plot 2 of the error amplifier 200 shown in FIG. 4. It can be seen that the pole $$\frac{1}{R_{lin} * C_z}$$

added by the compensation capacitor Cz increases low frequency gain as opposed to the bode plot 1 of a prior art error amplifier, such as error amplifier 11 of FIGS. 1A-1B.

The DC gain of the voltage regulator 100 is $gm_1 * r_{o1} * (1+gm_{p1} * R_{lin}) * gm_2 * r_{o2}$, where $gm_1$ is the transconductance of MN1 or MN2, $gm_{p1}$ is the transconductance of MP2, $r_{o1}$ is the output resistance of MP2, $R_{lin}$ is the linear resistance of MP4, $gm_2$ is the transconductance of the voltage to current converter 101, and $r_{o2}$ is the output resistance of the voltage to current converter 101.

The resulting poles of the voltage regulator 100 employing the error amplifier 200 are:

$$\frac{1}{(R_{o2}\|R_l) * C_L}, \frac{1}{R_{lin} * C_z}, \text{ and } \frac{1}{R_{01} * C_{par}},$$

and the resulting zero of the voltage regulator 100 is:

$$\frac{1 + (gm_{p1} * R_{lin})}{R_{lin} * C_z}.$$

Figure 5:
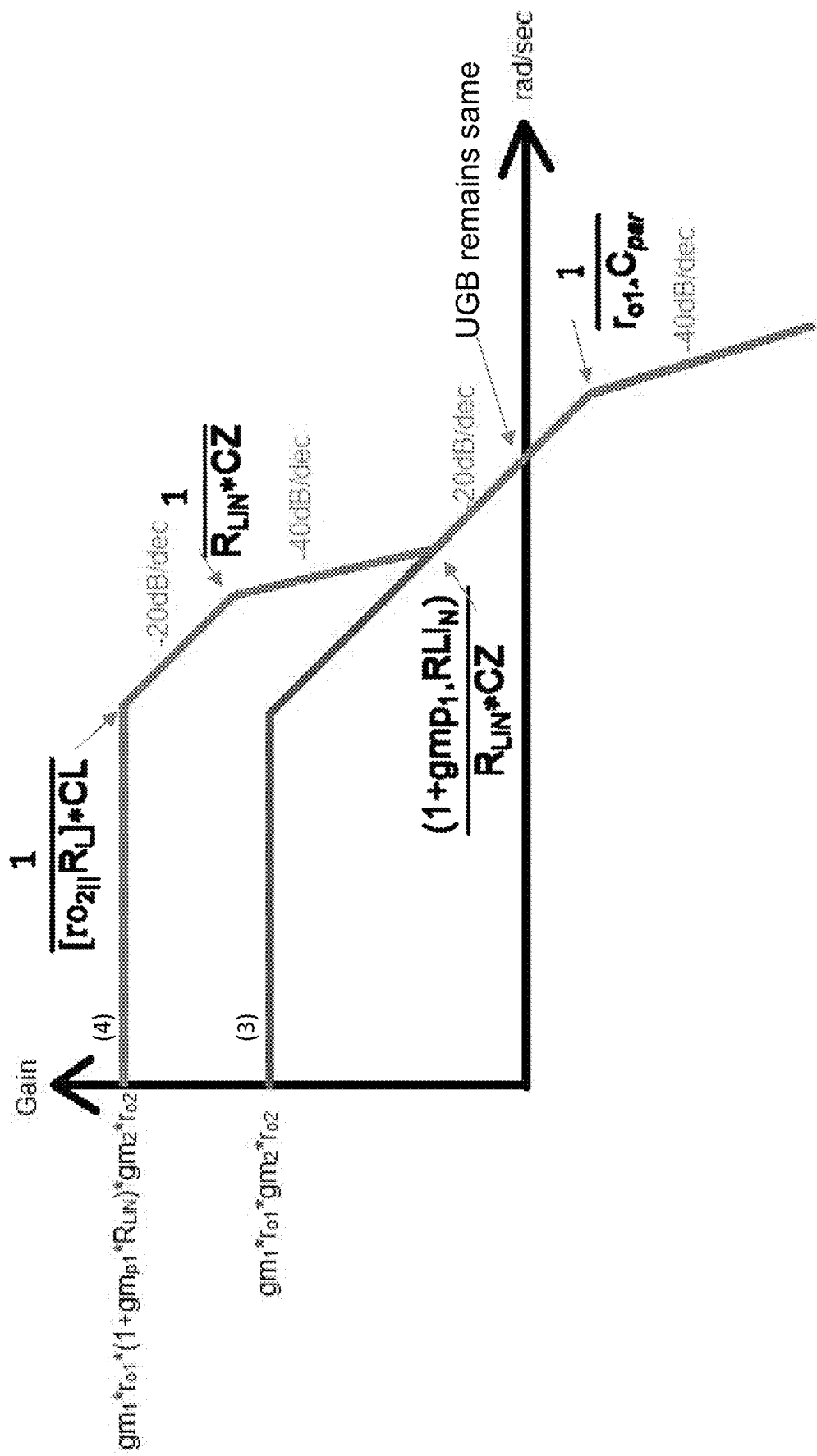
FIG. 5 is a magnitude of a bode plot of the voltage regulator of FIG. 2.

These are shown in the bode plot 4 of the voltage regulator 100 shown in FIG. 5. It can be seen that the poles $$\frac{1}{(R_{o2}\|R_l) * C_L} \text{ and } \frac{1}{R_{lin} * C_z}$$

added by the design of the error amplifier 200 provide for much greater low frequency gain as opposed to the bode plot 3 of a prior art voltage regulator, such as the voltage regulator 10 of FIG. 1A. In addition, it can be seen in the phase plot of FIG. 6 that the phase margin 6 of the voltage regulator 100 is close to the phase margin 5 of a prior art voltage regulator, such as the voltage regulator 10 of FIG. 1A, and that the unity gain bandwidths are substantially the same.

Figure 6:
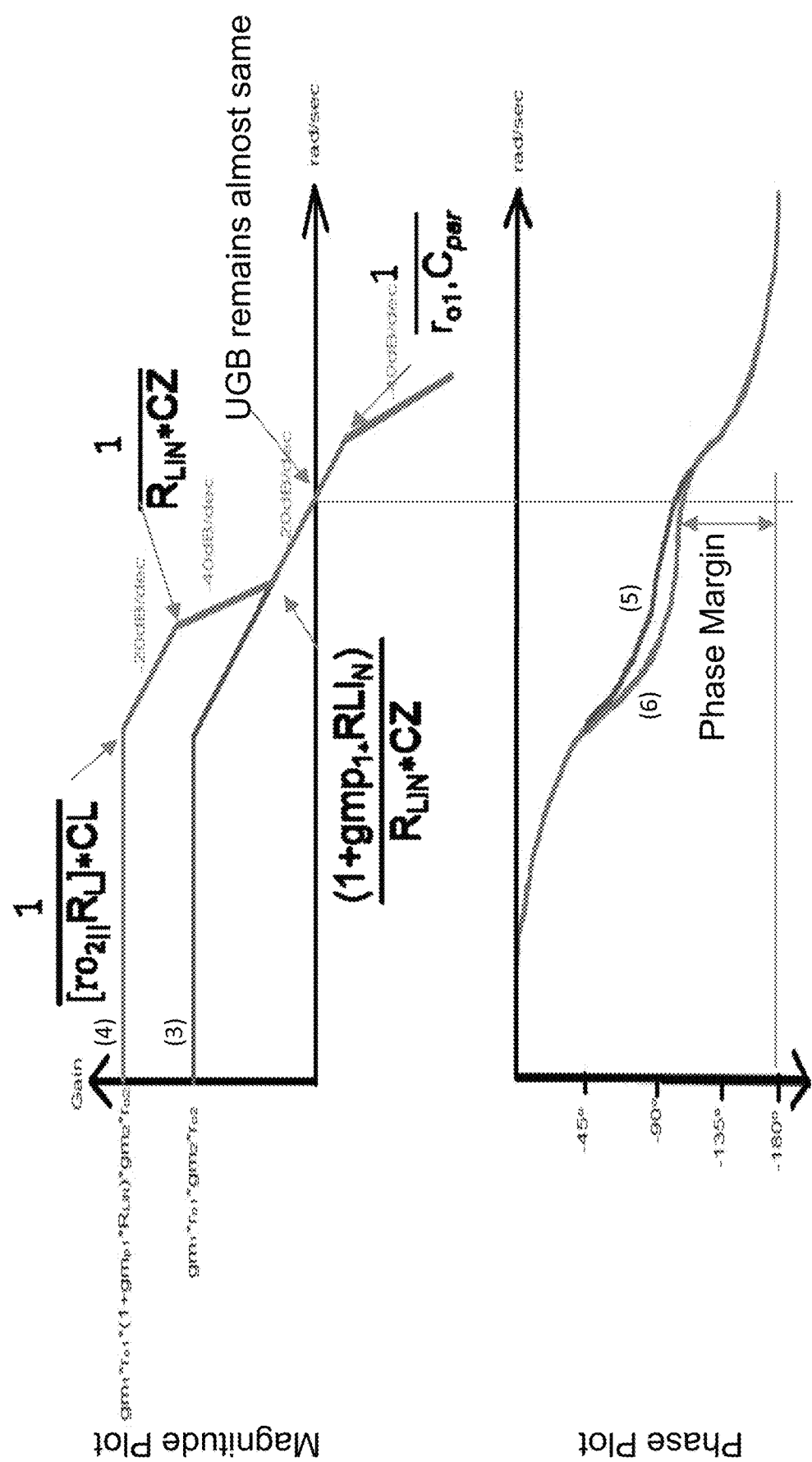
FIG. 6 is a bode plot (both magnitude and phase) of the voltage regulator of FIG. 2 correlated to the bode plot of the voltage regulator of FIG. 2.

From the bode plots described above and shown in FIGS. 4-5, and the phase plot shown in FIG. 6, the advantages of the voltage regulator 100 employing the error amplifier 200 design are apparent. Note that $R_{lin}$ tracks $r_{o1}$ as both result from MOSFET processes and operating conditions, as opposed to the prior art design of FIGS. 1A-1B where $R_{lin}$ is controlled by a poly-resistor process and $r_{o1}$ is controlled by MOSFET processes and operating conditions. This results in the compensation remaining stable over PVT.

In addition, near constant pole-zero separation results from this design, because $gm_{p1} * R_{lin}$ does not vary much across PVT. This can be seen mathematically because:

$$gm_{p1} * R_{lin} = \frac{(Vgs1 - Vth)}{K * (Vgs2 - Vth - Vds2)},$$

where Vgs2=Vgs1+Vds2, where Vgs1 is the gate to source voltage of MP2, Vgs2 is the gate to source voltage of MP4, and Vds2 is the drain to source voltage of MP4.

With this design, DC gain can be boosted without impacting the bandwidth. For example, if $1+gm_{p1} * R_{lin}$ is equal to M, then the DC gain would be boosted by $20 * \log_{10}(M)$.

In addition, bandwidth can be extended for a given DC gain by decreasing $r_{o1}$. For example, if $1+gm_{p1} * R_{lin}$ is set to M, ro1 can be reduced by 1/M, which shifts the pole $$\frac{1}{R_{01} * C_{par}}$$

to the right by me same amount. This can be utilized to reduce $C_L$ by $M^2$, which greatly saves on-chip area. This can also be utilized to reduce Ibias by M.

Therefore, unlike the prior art designs of FIGS. 1A-1B, the voltage regulator 100 and error amplifier 200 provide for the effective decoupling of gain, bandwidth, and bias current, and the compensation provided tracks with PVT variations. This provides for more robust performance, which can allow the building of devices using smaller processes or the lowering of power consumption.

Figure 7:
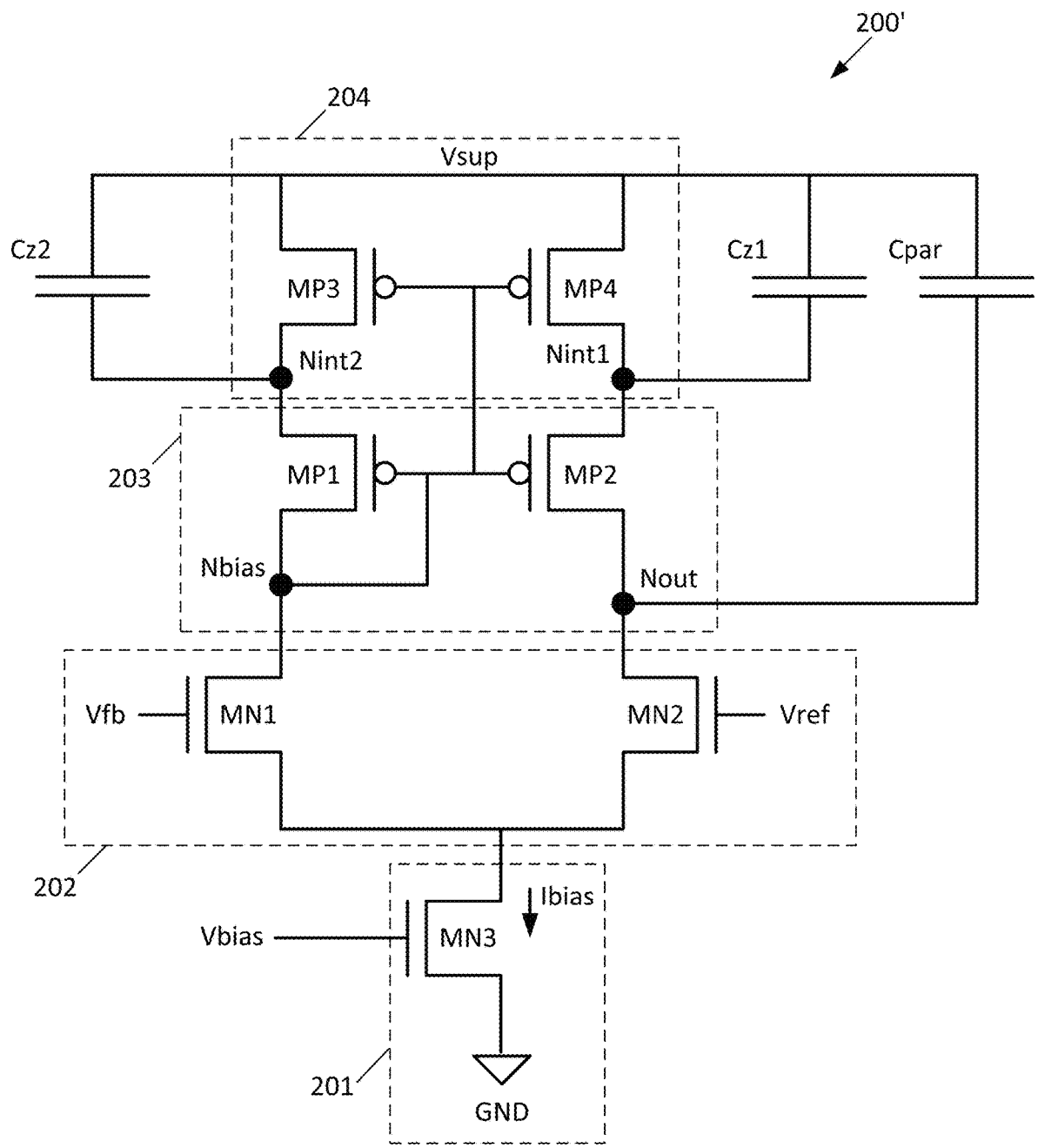
FIG. 7 is a schematic diagram of a variant of the error amplifier of the voltage regulator of FIG. 2.

Variations on the design of the error amplifier 200 will now be described. Shown in FIG. 7 is a variant where two compensation capacitors are present. Thus, the error amplifier 200' in FIG. 7 includes a first compensation capacitor Cz1 coupled between the intermediate node Nint1 and the supply node Vsup, and a second compensation capacitor Cz2 coupled between the intermediate node Nint2 and the supply node Vsup. This design increases the gain before the first pole.

Figure 8:
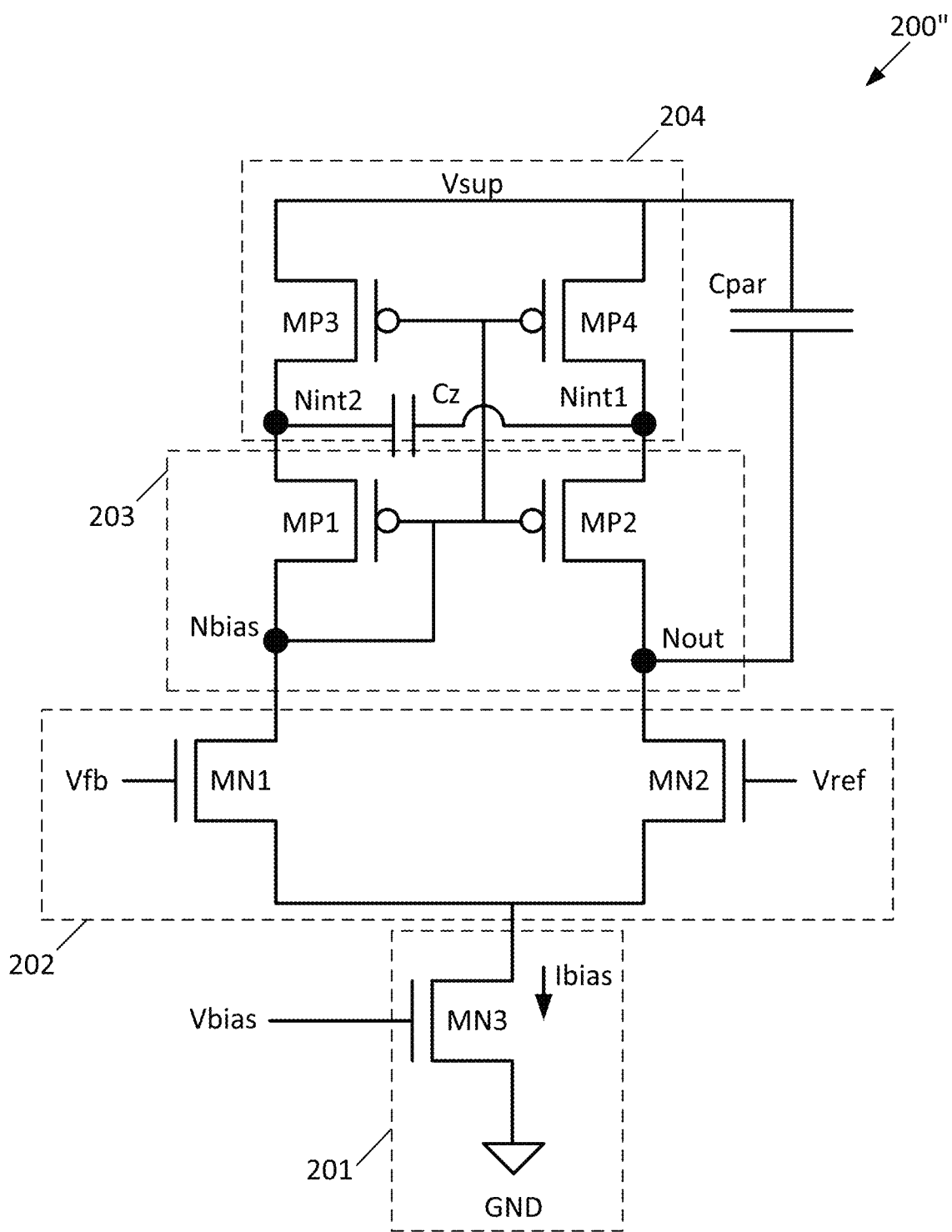
FIG. 8 is a schematic diagram of another variant of the error amplifier of the voltage regulator of FIG. 2.

Shown in FIG. 8 is another variant where the compensation capacitor Cz of the error amplifier 200" is connected between the intermediate nodes Nint1 and Nint2, and is not directly electrically connected to the supply voltage Vsup. In this instance, the value of Cz is actually one half of the value of Cz in the design of FIG. 3, and one quarter of the sum of the values of Cz1 and Cz2 in FIG. 7. This can help reduce area consumption.

In any of the above error amplifier designs 200, 200', and 200", transistors MP3 and MP4 may or may not have the same ratio of width to length as each other, depending upon design constrains and desires. In addition, transistors MP1 and MP2 may or may not have the same ratio of width to length as each other, or as MP3 and MP4.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. An error amplifier, comprising:
   a differential pair of input transistors receiving a first voltage and a second voltage;
   a first pair of transistors coupled to the differential pair of input transistors at an output node and a bias node, the first pair of transistors configured to operate in a saturation region;
   a second pair of transistors coupled to the first pair of transistors at a pair of intermediate nodes and configured to operate in a linear region; and
   a compensation capacitor coupled to one node of the pair of intermediate nodes so as to compensate the error amplifier for a parasitic capacitance at the output node;

wherein an output of the error amplifier at the output node is a function of a difference between the second voltage and the first voltage.

2. The error amplifier of claim 1, wherein gates of the second pair of transistors are directly electrically connected to gates of the first pair of transistors and further connected to one transistor of the second pair of transistors.

3. The error amplifier of claim 1, wherein the differential input pair of transistors are n-channel transistors; wherein the first pair of transistors are p-channel transistors; and wherein the second pair of transistors are p-channel transistors having sources coupled to a supply voltage and drains coupled respectively to the pair of intermediate nodes.

4. The error amplifier of claim 3, wherein the parasitic capacitance is coupled between the output node and the supply voltage; and wherein the compensation capacitor is coupled between one node of the pair of intermediate nodes and the supply voltage.

5. The error amplifier of claim 3, wherein the parasitic capacitance is coupled between the output node and the supply voltage; and wherein the compensation capacitor comprises:
a first compensation capacitor coupled between a first node of the pair of intermediate nodes and the supply voltage; and
a second compensation capacitor coupled between a second node of the pair of intermediate nodes and the supply voltage.

6. The error amplifier of claim 3, wherein the parasitic capacitance is coupled between the output node and the supply voltage; and wherein the compensation capacitor is coupled between the pair of intermediate nodes.

7. The error amplifier of claim 3, wherein transistors of the second pair of transistors have different sizes and transistors of the first pair of transistors have a same size.

8. The error amplifier of claim 3, wherein transistors of the second pair of transistors have a same first size and transistors of the first pair of transistors have a same second size, the first size being larger than the second size.

9. The error amplifier of claim 3, wherein one transistor of the second pair of transistors has a first size, another transitor of the second pair of transistors has a second size different from the first size, and the transistors of the first pair of transistors have a same third size, the first and second sizes being larger than the third size.

10. A circuit, comprising:
a tail current source;
a differential pair comprising:
a first NMOS transistor having a source directly electrically connected to the tail current source, a drain directly electrically connected to a bias node, and a gate biased by a first voltage; and
a second NMOS transistor having a source directly electrically connected to the tail current source, a drain directly electrically connected to an output node, and a gate biased by a second voltage;
a load circuit comprising:
a first PMOS transistor having a drain directly electrically connected to the bias node, a source, and a gate directly electrically connected to the bias node;
a second PMOS transistor having a drain directly electrically connected to the output node, a source directly electrically connected to an intermediate node, and a gate directly electrically connected to the bias node;
a third PMOS transistor having a drain directly electrically connected to the source of the first PMOS transistor, a source directly electrically connected to a supply node, and a gate directly electrically connected to the bias node; and
a fourth PMOS transistor having a drain directly electrically connected to the intermediate node, a source directly electrically connected to the supply node, and a gate directly electrically connected to the bias node; and
a compensation capacitor directly electrically connected to the intermediate node.

11. The circuit of claim 10, wherein the compensation capacitor is directly electrically connected between the intermediate node and the supply node.

12. The circuit of claim 10, wherein the compensation capacitor is directly electrically connected between the intermediate node and the drain of the third PMOS transistor.

13. The circuit of claim 10, further comprising an additional compensation capacitor directly electrically connected between the supply node and the drain of the third PMOS transistor.

14. The circuit of claim 10, wherein the third and fourth PMOS transistors have a same width and length.

15. The circuit of claim 10, wherein the third PMOS transistor has a different width and length than the fourth PMOS transistor.

16. A voltage regulator, comprising:
an error amplifier receiving a reference voltage and a feedback voltage as input, and producing an error voltage as a function of a difference between the reference voltage and the feedback voltage;
a voltage to current converter configured to convert the error voltage to an output current; and
a feedback resistance receiving the output current and generating the feedback voltage;
wherein the error amplifier comprises:
a differential pair of input transistors receiving the feedback voltage and the reference voltage;
a first pair of transistors coupled to the differential pair of input transistors at an output node and a bias node, the first pair of transistors configured to operate in a saturation region;
a second pair of transistors coupled to the first pair of transistors at a pair of intermediate nodes and configured to operate in a linear region; and
a compensation capacitor coupled to one node of the pair of intermediate nodes so as to compensate the error amplifier for a parasitic capacitance at the output node;
wherein an output of the error amplifier at the output node is a function of a difference between the reference voltage and the feedback voltage.

17. The error amplifier of claim 16, wherein gates of the second pair of transistors are directly electrically connected to gates of the first pair of transistors and further connected to one transistor of the second pair of transistors.

18. The error amplifier of claim 16, wherein the differential input pair of transistors are n-channel transistors; wherein the first pair of transistors are p-channel transistors; and wherein the second pair of transistors are p-channel transistors having sources coupled to a supply voltage and drains coupled respectively to the pair of intermediate nodes.

19. The error amplifier of claim 18, wherein the parasitic capacitance is coupled between the output node and the supply voltage; and wherein the compensation capacitor is coupled between one node of the pair of intermediate nodes and the supply voltage.

20. The error amplifier of claim 18, wherein the parasitic capacitance is coupled between the output node and the supply voltage; and wherein the compensation capacitor comprises:
 a first compensation capacitor coupled between a first node of the pair of intermediate nodes and the supply voltage; and
 a second compensation capacitor coupled between a second node of the pair of intermediate nodes and the supply voltage.

21. The error amplifier of claim 18, wherein the parasitic capacitance is coupled between the output node and the supply voltage; and wherein the compensation capacitor is coupled between the pair of intermediate nodes.

22. The error amplifier of claim 18, wherein transistors of the second pair of transistors have different sizes and the transistors of the first pair of transistors have a same size.

23. The error amplifier of claim 18, wherein transistors of the second pair of transistors have a same first size and the transistors of the first pair of transistors have a same second size, the first size being larger than the second size.

24. The error amplifier of claim 18, wherein one transistor of the second pair of transistors has a first size, another transistor of the second pair of transistors has a second size different from the first size, and transistors of the first pair of transistors have a same third size, the first and second sizes being larger than the third size.

25. A method of providing independence between DC gain and bandwidth in a differential amplifier, the method comprising:
 coupling an active load to a differential input pair of transistors so that an output node of the active load is decoupled from an intermediate node of the active load;
 operating a first pair of transistors of the active load in a saturation region and operating a second pair of transistors of the active load in a linear region; and
 coupling a compensation capacitor to the intermediate node so as to add a second pole and an additional zero to a transfer function of the differential amplifier, the second pole serving to increase low frequency gain of the differential amplifier, wherein the transfer function has a first pole and a zero but would not have the second pole and the additional zero without the compensation capacitor.

26. An error amplifier, comprising:
 an input stage receiving a feedback voltage and a reference voltage;
 a linear amplification stage;
 a saturation amplification stage coupled between the input stage and the linear amplification stage; and
 a compensation stage coupled across the linear amplification stage.

27. The error amplifier of claim 26, wherein the linear amplification stage is coupled between the saturation amplification stage and a supply voltage; and further comprising a tail current source coupled between the input stage and ground.

28. The error amplifier of claim 26, wherein the compensation stage comprises a pair of compensation capacitors coupled in parallel with the compensation stage.

29. The error amplifier of claim 26, wherein the compensation stage comprises a single compensation transistor coupled in parallel with the compensation stage.

* * * * *